ETCHING TECHNIQUE FOR FABRICATING
SEMICONDUCTOR OR CERAMIC DEVICES
Filed March 7, 1961

INVENTORS J.R. LIGENZA
H.M. SHAPIRO
BY H. W. Lockhart
ATTORNEY 3,122,463

ETCHING TECHNIQUE FOR FABRICATING SEMICONDUCTOR OR CERAMIC DEVICES

Joseph R. Ligenza, Westfield, and Herbert M. Shapiro, Somerville, N.J., assignors to Bell Telephone Laboratories, Incorporated, New York, N.Y., a corporation of New York Filed Mar. 7, 1961, Ser. No. 94,056
4 Claims. (Cl. 156—4)

This invention relates to selective etching techniques. In its most important aspect, this invention relates to selective etching techniques useful in the manufacture of diffused semiconductor devices. As will become evident, it has wider applicability.

In this connection, the term "diffused semiconductor device" refers to a semiconductor device including a PN junction formed by exposing, at elevated temperatures, portions of the surface of a semiconductor wafer to a vapor of a significant or conductivity type determining impurity.

One of the major continuing problems in the manufacture of a diffused semiconductor device is the control of the geometry of the PN junction included therein. This problem is resolved, at present, by forming a diffusion resistant coating over the surface of a semiconductor wafer and etching a pattern through this resistant layer typically by the known photo-resist technique. For a silicon substrate the resistant layer typically is a thermally grown $SiO_2$ coating as disclosed in Patent 2,802,760, issued August 13, 1957, to L. Derick and C. J. Frosch. The diffusion resistant layer, accordingly, is formed into a mask for a subsequent diffusion step. The underlying semiconductor surface thus is exposed selectively and can be subjected to a vapor of a significant impurity to provide a PN junction of the geometry required.

Although the photo-resist technique is highly accurate and widely accepted commercially, it has certain disadvantages which make the technique difficult to employ, and, accordingly, expensive to use. One of these disadvantages is the nonuniformity of the photo-resist emulsion itself, requiring testing and procedural variations from batch to batch. Another disadvantage is that the process leaves on the surface of the semiconductor wafer an organic residue which is deleterious and must be removed. In addition, difficulties encountered in removing the residue result in devices of varying characteristics.

Accordingly, it is a particular object of this invention to provide a simple and inexpensive method for fabricating diffused semiconductor devices.

A still more specific object of this invention is a method for shaping a resistant overlayer for controlling a subsequent diffusion of significant impurities into a semiconductor substrate.

A number of chemicals are known to react in the presence of radiation of some threshold energy. Typically, chemicals which are radiation-sensitive such as the silver halides and vinyl monomers are used in the photographic art and in the production of polymers, respectively. Moreover, other chemicals, such as the organic halides are notoriously stable. Accordingly, the radiation which would be required for any practical use of the photodecomposition of organic halides also would be uncontrollable. However, we have found that $F_2O$ (fluorine monoxide) gas is particularly sensitive in the presence of radiation from commercially available sources to certain resistant layers useful in the fabrication of diffused semiconductor devices. Therefore, in accordance with a particular aspect of the invention, a semiconductor wafer is coated with a layer of diffusion resistant material, advantageously silicon dioxide, and disposed in an atmosphere of $F_2O$ gas. Subsequently, radiation in accordance with a pattern is directed through the $F_2O$ gas at the resistant film whereupon the gas is dissociated to form an etchant which selectively etches the resistant film.

Accordingly, a feature of this invention is the decomposition, by radiation in accordance with a pattern, of $F_2O$ gas to etch selectively a diffusion-resistant overlayer and expose the underlying semiconductor surface.

In one embodiment of this invention, a diffusion resistant silicon dioxide coating is grown thermally on the surface of a silicon semiconductor wafer. The thus prepared wafer is placed in a copper enclosure provided with a calcium fluoride window. The enclosure is filled with $F_2O$ gas and exposed to radiation of wavelength suitable for decomposing the gas in accordance with a pattern. Radiation of less than 4,210 Angstrom units wavelength is effective for this purpose and the range between 2,100 and 2,600 Angstroms is preferred. The etching proceeds rapidly and is restricted to those areas of the silicon dioxide surface which are illuminated.

Further objects and features of this invention will become apparent during the detailed discussion rendered in relation to the drawing, wherein.

Figure 1:
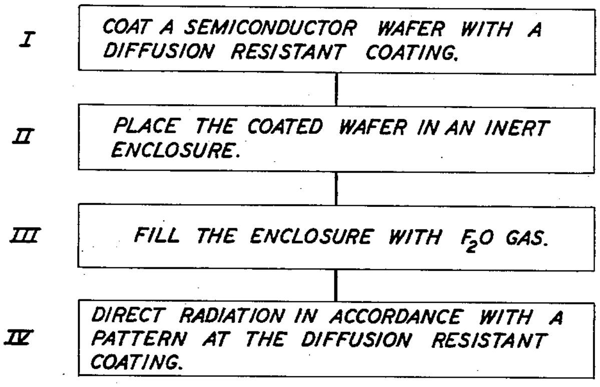
FIG. 1 is a block diagram representing the method in accordance with this invention.

It is to be understood that the drawing is for illustrative purposes only and, therefore, not necessarily to scale.

The first step in accordance with this invention in its preferred embodiment is to coat the surface of a semiconductor wafer with a diffusion resistant coating as indicated by block I of the flow diagram of FIG. 1. Typically, the semiconductor wafer is a slice of silicon .400 x .400 x .020 inch and the diffusion resistant coating is a thermally grown oxide film about 10,000 Angstrom units thick. As indicated by block II, the coated wafer is placed inside an inert enclosure which is provided with a window transparent to radiation, such as calcium fluoride ($CaF_2$) or magnesium fluoride ($MgF_2$) plate. The enclosure then is filled with $F_2O$ (fluorine monoxide) gas, typically at room temperature and atmospheric pressure, whereafter, incident radiation typically from a high pressure mercury lamp in accordance with a pattern is directed through the transparent window at the coated surface of the semiconductor wafer. This procedure is indicated in FIG. 1 by blocks III and IV respectively.

Figure 2:
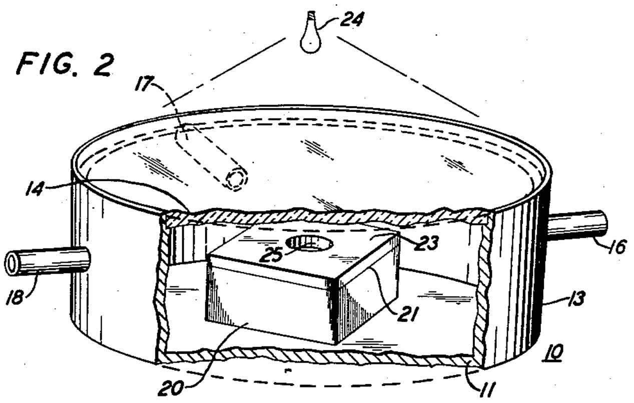
FIG. 2 is a perspective view partially in cross section of an arrangement in accordance with this invention.

The arrangement of FIG. 2 has been found particularly convenient for the practice of the method of FIG. 1. The receptacle 10 conveniently is cylindrical in shape having a disk-shaped portion 11 connected to one end of a tubular portion 13 and a disk-shaped portion 14 detachably secured to the opposite end.

Inlet tube 16 is connected to a supply (not shown) of the $F_2O$ gas; inlet tube 17 is connected to a supply (not shown) of an inert gas such as nitrogen used for flushing out the system prior to use in accordance with this invention. Outlet tube 18 is connected to a sink (not shown) for the disposal of the contaminated and unused gas.

A suitable starting material 20 is positioned inside the receptacle 10. A major surface 21 of the starting material is positioned substantially parallel to the transparent disk portion 14. A radiation mask 23 is positioned between the radiation source 24 and the surface 21. Hole or holes 25 are provided in the mask for forming a pattern of radiation incident upon surface 21.

Advantageously, mask 23 is positioned beneath disk portion 14 substantially in contact with surface 21. In this case the mask is made of material unreactive with the $F_2O$ gas or its decomposition products such as fluorinated aluminum. Means for maintaining the receptacle 10, the mask 23 and the radiation source 24 in spaced relation comprises well known support and clamping means (not shown).

In the preferred embodiment, the receptacle 10 is fabricated from copper sheeting and is adapted to receive a $CaF_2$ (calcium fluoride) disk portion 14. Inlet tube 16 is connected to a supply of $F_2O$ (fluorine monoxide) and inlet tube 17 is connected to a supply of nitrogen.

Figure 3:
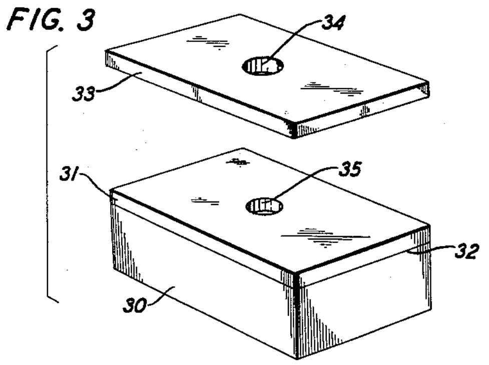
FIG. 3 is a perspective view of a mask employed and the corresponding geometry formed in accordance with this invention.

In more detail as shown in FIG. 3, the slice of silicon 30 is positioned within the receptacle. Slice 30 has a silicon dioxide layer 31 thermally grown by well known techniques on surface 32 of the slice. Mask 33, provided with at least one hole 34, is positioned substantially in contact with layer 31. Upon exposure to radiation, the $F_2O$ gas dissociates to form hole 35 in the oxide layer 31.

It is not necessary for the mask to be in contact with oxide layer 31. In some instances contact is undesirable. For example, in the automation of a process in accordance with this invention, it may be desirable to position the slice 30 on a conveyor belt in which case contact between the mask and the slice would hinder the desirable relative motion. Similarly, it may be advantageous in certain instances to remove the mask from the interior of receptacle 10 and merely to project an image of the desired pattern at oxide layer 31.

The enclosure in accordance with this invention preferably is substantially inert to the $F_2O$ and to its dissociation products. Ordinarily copper is not inert to a free fluorine radical. However, it has been found that copper quickly forms a protective coating of copper fluoride when exposed to the fluorine and is rendered inert thereby. There are several other materials which are useful in fabricating the enclosure such as calcium fluoride, magnesium fluoride, silica coated with magnesium fluoride, and aluminum. However, glass is not particularly suitable because it is etched by the dissociation products and, as a result, not only disperses the incident radiation but also reduces significantly the rate at which the selective etching of the resistant layer proceeds.

The time required to produce the desired pattern in the substrate depends, for any given material, temperature and pressure, on the delivered radiation intensity. For example, oxide layer 31 is typically 10,000 Angstrom units thick. Subjecting a layer of this thickness in an $F_2O$ ambient at room temperature and atmospheric pressure to radiation from a 100-watt high pressure mercury lamp requires in excess of an hour to expose the surface of the silicon slice. However, as the wattage or the temperature is increased the time required to expose the surface of silicon slice is decreased.

More specifically, the observed results indicate that the radiation dissociates the $F_2O$ into atomic fluorine, molecular fluorine and oxygen, the atomic fluorine being highly reactive with the oxide overlayer. An increase in the delivered radiation increases the amount of atomic fluorine and, accordingly, the reaction with the oxide layer.

In the described embodiments no attempt is made to collimate the radiation or to increase by reflecting means the radiation delivered to the workpiece. However, it is known that these expedients increase the amount of energy delivered by a particular radiation source, therefore efforts in this direction would increase the etch-rate substantially.

Typically, the wavelength of the radiation effective is 4,210 Angstrom units and less. However, the reaction is most efficient for radiation of wavelengths between 2,100 and 2,600 Angstrom units. Commercial radiation sources normally provide radiation over a wide range of wavelengths.

In practice it is advantageous to allow about 10 Angstrom units of the $SiO_2$ layer to remain coating the silicon substrate. The uncontrolled etching of the silicon substrate is avoided by this expedient and the subsequent processing steps are not hindered by so thin an oxide layer. Specifically, the silicon substrate becomes pitted in an uncontrolled manner unless care is taken to exclude $H_2O$ and $O_2$ from the system (see Journal of Applied Physics, volume 31, No. 5,940, May 1960).

Advantageously, the method in accordance with this invention is utilized not to expose the silicon slice but merely to reduce selectively the thickness of the oxide layer. In such a case, as is frequently required with double diffusion techniques, the radiation is regulated typically by varying the opacity of the radiation mask.

Typically, processes in accordance with this invention are carried out at room temperature where a high degree of control is afforded through, for example, control of the radiation intensity. Nevertheless, the temperature may be increased or decreased without substantial effect on the efficacy of the invention. However, it is to be kept in mind that $F_2O$ becomes highly reactive with certain of the possible substrate materials at critical temperatures (about 200 degrees centigrade for some substrate materials) and, accordingly, the temperature advantageously is kept substantially below the critical value. Moreover, at low temperatures (−78 and −153 degrees centigrade, respectively), $F_2O_2$ and $F_2O_3$ may be used as well as $F_2O$ in accordance with this invention. On exposure to radiation at appropriate temperatures $F_2O_2$ and $F_2O_3$ can be expected to yield atomic fluorine in a procedure similar to that described above.

The reaction between the fluorine and the oxide layer is attenuated by the recombination rate or the lifetime of the atomic fluorine. However, the effect of the recombination is to enhance the resolution because the reaction is restricted thereby substantially to the radiation image on the oxide layer. The atomic fluorine generated in the unexposed $F_2O$ is so ephemeral as to produce no apparent effect on the oxide layer.

More specifically, the resolution obtained by the method of this invention depends, primarily, on the lifetime or the mean free path of the atomic fluorine liberated during the reaction. The mean free path of the atomic fluorine in turn depends on the pressure and temperature during the reaction. For the resolution required for most purposes atmospheric pressure and room temperature have been found quite satisfactory. However, if fine resolution, for example, within one or two microns, is sought it may be desirable to increase the pressure and decrease the temperature. If even finer resolution is required, an additive may be included in the system to react immediately with the free fluorine radical. One such additive is sulfur tetrafluoride. However, experiments indicate that resolution of one or two microns can be achieved without additives and at atmospheric pressure and room temperature.

The method of this invention is not restricted to the silicon-silicon dioxide system. Silicon dioxide can be deposited on a variety of substrates such as copper, germanium, and gallium arsenide to form masks for the control of subsequent etching of the substrate. Moreover, silicon monoxide or other diffusion resistant materials which form volatile fluorides are useful as overlayers in accordance with this invention. In this connection, the term "diffusion resistant" refers to a layer of material having a thickness necessary to prevent diffusion of a particular conductivity type determining impurity into a semiconductor substrate. As is well known in the art, the resistant material as well as its thickness varies with the diffusant material.

The method of this invention also is particularly promising in the fabrication of printed circuitry from tantalum or any other metal which forms a volatile fluoride such as chromium and tungsten. Moreover, the machining of objects of ceramic material which forms a volatile fluoride such as zirconium oxide ($ZrO_2$) and titanium oxide ($TiO_2$) is facilitated in accordance with this invention. Accordingly, the embodiments described are intended only as an illustration of the preferred form of the invention.

The following are examples of the use of the described technique.

A slice of silicon semiconductor material .400 x .400 x .020 inch was heated in a steam bomb to grow a silicon dioxide layer about 10,000 Angstrom units thick over the entire surface of the slice. The resulting oxide encrusted slice was exposed to $F_2O$ gas, as illustrated in FIG. 2. A static system was used (that is, zero flow rate). A fluorinated aluminum mask was placed in contact with a major surface of the slice. The mask was about .400 x .400 x .010 inch and included a plurality of perforations. A 100-watt (Hanovia-type SH–100) high pressure mercury lamp operated from a 250-watt transformer was positioned about one inch from the surface of the oxide layer. In less than three hours the surface of the silicon substrate was selectively exposed in accordance with the pattern. In this example, the oxide layer was completely penetrated, although, in practice, complete penetration may be undesirable as indicated above.

A copper sheet 0.5 x 0.5 x .0005 inch mounted on an alumina ($Al_2O_3$) support was coated with a layer of $SiO_2$ 10,000 Angstrom units thick by the thermal decomposition of ethyl-triethoxy silane. The coated copper was exposed in an $F_2O$ ambient to a 100-watt radiation source through a calcium fluoride window including a negative of the circuit arrangement painted with Aquadag and opaque to the radiation. The thus coated copper sheet was irradiated for about three hours in accordance with the pattern of the circuit arrangement to selectively etch through the $SiO_2$ layer and selectively expose the copper sheet. Subsequent etching in a 50 percent solution of nitric acid formed the copper into the desired pattern. The remaining oxide coating finally was removed in a concentrated (48 percent) solution of hydrofluoric acid.

An alumina plate including an evaporated overlayer of tantalum 1,000 Angstrom units thick was placed in an inert receptacle in contact with a fluorinated aluminum mask as illustrated in FIG. 2. The receptacle subsequently was filled with $F_2O$ gas in a static system. Radiation from a 100-watt radiation source positioned about one inch from the surface of the tantalum was directed at this surface through a calcium fluoride window. After less than four minutes of exposure the mask pattern was selectively etched through the tantalum.

The above described illustrative embodiments are susceptible of numerous and varied modifications, all clearly within the spirit and scope of the principles of the present invention, as will be apparent to those skilled in the art. No attempt has been made here to illustrate exhaustively all such possibilities.

What is claimed is:

1. In the fabrication of a semiconductor device from a semiconductor wafer of one conductivity type, the steps of forming from a group of diffusion resistant materials consisting of silicon dioxide and silicon monoxide, an oxide layer on a surface of said wafer, said oxide layer being of a diffusion resistant thickness, enclosing the thus coated wafer in an $F_2O$ gas ambient, directing at said wafer radiation in accordance with a pattern for a time and at a wavelength to penetrate said oxide layer following said pattern and expose selectively said surface, removing said $F_2O$ gas ambient and subjecting said surface to a vapor of an impurity of the opposite conductivity type for converting selectively at least one surface portion of said wafer to the opposite conductivity type.

2. In the fabrication of a semiconductor device from a silicon semiconductor wafer, the steps of coating a surface of said wafer with a coating of $SiO_2$, said coating being of a diffusion resistant thickness, enclosing the coated wafer in fluorine monoxide ($F_2O$) gas, and exposing said coated wafer to radiation in accordance with a pattern for a time to etch away said coating following said pattern, said radiation having a wavelength of less than 4,210 Angstrom units.

3. In the fabrication of a semiconductor device from a silicon semiconductor wafer, the steps of coating a surface of said wafer with a coating of $SiO_2$, said coating being of a diffusion resistant thickness, enclosing the coated wafer in fluorine monoxide ($F_2O$), and exposing said coating to radiation in accordance with a pattern for a time to etch through said coating following said pattern, said radiation having a wavelength of between 2,100 and 2,600 Angstrom units.

4. A method for selectively etching ceramic material, said method comprising the steps of selecting a ceramic material from a class consisting of zirconium oxide and titanium oxide, enclosing said material in an $F_2O$ gas ambient, and directing at said material radiation in accordance with a pattern for etching said ceramic material following said pattern, said radiation being of a wavelength and for a time to penetrate selectively said material.

References Cited in the file of this patent

UNITED STATES PATENTS

| | | |
|---|---|---|
| 2,445,238 | Nicoll et al. | July 13, 1948 |
| 2,583,681 | Brittain et al. | Jan. 29, 1952 |
| 2,841,477 | Hall | July 1, 1958 |
| 2,992,586 | Upton | July 18, 1961 |

OTHER REFERENCES

Mellor: "Comprehensive Treatise on Inorganic and Theoretical Chemistry, Nov. 30, 1956, Supplement II, Part I, page 191.

Chemical Abstracts, 1956, vol. 50, col. 16, 483.